US007789192B2

(12) United States Patent
Barrios et al.

(10) Patent No.: US 7,789,192 B2

(45) Date of Patent: Sep. 7, 2010

(54) LOUDSPEAKER PORT HANDLE

(75) Inventors: Lorenzo Barrios, Covina, CA (US); Yasushi Shimabukuro, Mission Viejo, CA (US)

(73) Assignee: QSC Audio Products, Inc., Costa Mesa, CA (US)

( * ) Notice: Subject to any disclaimer, the term of this patent is extended or adjusted under 35 U.S.C. 154(b) by 29 days.

(21) Appl. No.: 12/013,899

(22) Filed: Jan. 14, 2008

(65) Prior Publication Data

US 2008/0169151 A1 Jul. 17, 2008

Related U.S. Application Data

(60) Provisional application No. 60/880,086, filed on Jan. 12, 2007.

(51) Int. Cl.
*H05K 5/00* (2006.01)

(52) U.S. Cl. ....................... 181/156; 181/144; 181/152; 181/154

(58) Field of Classification Search ................. 181/156, 181/152, 154, 155; D14/214
See application file for complete search history.

(56) References Cited

U.S. PATENT DOCUMENTS 2,205,804 A * 6/1940 Wells ......................... 181/155
2,642,948 A * 6/1953 Olson et al. ................. 181/152
2,751,997 A * 6/1956 Gately, Jr. ................... 181/152
4,201,274 A * 5/1980 Carlton ....................... 181/156
4,593,784 A * 6/1986 Flanders ..................... 181/144
5,821,471 A * 10/1998 McCuller .................... 181/156
5,936,209 A * 8/1999 Alton, Jr. .................... 181/151
6,349,792 B1 * 2/2002 Smith, Jr. et al. ........... 181/156
6,411,721 B1 * 6/2002 Spindler ..................... 381/349
6,560,343 B1 * 5/2003 Kim ........................... 381/349
7,011,178 B2 * 3/2006 Morkerken ................. 181/151
2003/0183444 A1 * 10/2003 Cass .......................... 181/152
2004/0017924 A1 * 1/2004 Kuratani et al. ............. 381/349
2004/0238268 A1 * 12/2004 Danley et al. .............. 181/199

* cited by examiner

*Primary Examiner*—Jeffrey Donels
*Assistant Examiner*—Forrest M Phillips
(74) *Attorney, Agent, or Firm*—Dickstein Shapiro LLP

(57) ABSTRACT

A ported or bass-reflex loudspeaker includes one or more ports incorporated into the loudspeaker cabinet without corresponding increase in cabinet dimensions. In one embodiment, this may be accomplished by integrating the one or more ports into one or more corresponding side panels of the loudspeaker cabinet. In another embodiment, the port(s) may also (or instead) be incorporated into a rear panel of the subject loudspeaker. In another embodiment, the one or more ports may be integrated with and function as handles for gripping and/or transporting the loudspeaker.

19 Claims, 4 Drawing Sheets

*PRIOR ART*

LOUDSPEAKER PORT HANDLE

CROSS REFERENCE TO RELATED APPLICATION

This application claims the benefit of U.S. Provisional Application No. 60/880,086, filed Jan. 12, 2007.

FIELD OF THE INVENTION

The invention relates to loudspeakers and in particular to loudspeakers having one or more side- or rear-mounted ports with an optionally integrated handle feature.

BACKGROUND OF THE INVENTION

Ported loudspeakers have been used to reduce acoustic re-radiation associated with the loudspeaker cabinet designs. For example, FIG. 1 depicts a cross-sectional view of a conventional ported loudspeaker 100. The loudspeaker 100 is housed in a cabinet 110, which includes a front baffle 120. In the example of FIG. 1, two drivers 130 and 140 are mounted to the baffle 120, although such ported loudspeakers 100 can have more or fewer drivers. Consistent with conventional ported loudspeakers, the port 150 is located on the front baffle 120, and adjacent to the drivers 130 and 140. Ducts 160 extend some distance back into the interior of cabinet 110. Numerous variations on the shape and length of the ducts 160 have been used in the prior art. It is generally known that the port 150 converts the rearward radiation of the bass loudspeaker into useful forward low frequency energy propagation, while providing low frequency output extension. Ported, or so-called 'bass-reflex' loudspeakers, are in common usage for a great many applications.

It is generally known that when the loudspeaker moves inward, it compresses the air within the cabinet, which in turn drives the "lump" of air outward through the duct. Its momentum takes it outside the body of the port a small distance, which rarifies the air inside the port, which then sucks the 'lump' of air back in.

While this activity is taking place, the loudspeaker is continuing its reciprocal movement, subsequently creating a partial vacuum and expanding the air within the cabinet. This decrease in pressure at the port inlet sucks the air in the port inward and the momentum of the air mass takes it beyond the port which compresses the air within the cabinet, which then drives the air mass back into the port, and so on.

This port radiation can be analogized to a vibrating mass connected to a spring, wherein the air within the port is a mass, the air within the cabinet functions as a spring and the driving force is the loudspeaker. At the resonant frequency of the port (i.e., the air mass within), small movements of the loudspeaker are needed to provide the power to keep the oscillation going.

Such ports have heretofore been mounted on the baffle of the loudspeaker, primarily so that all radiating sources are located beneath the grill covering. While ported loudspeakers may enjoy certain acoustical advantages over non-ported loudspeakers, with high-performance loudspeakers the ports can require substantial surface area to perform properly, thus making the loudspeaker substantially larger than otherwise needed for a non-ported system.

Accordingly, there is a need for a loudspeaker design which includes the benefits of a bass-reflex design, but without substantially adding to the size of the loudspeaker housing.

BRIEF SUMMARY OF THE INVENTION

Disclosed and claimed herein are bass-reflex loudspeakers having one or more side- or rear-mounted ports with an integrated handle feature. In one embodiment, a bass-reflex loudspeaker comprises a loudspeaker cabinet having a front baffle, a first side baffle adjacent to the front baffle, a second side baffle adjacent to the front baffle, and a rear baffle oriented opposite to the front baffle and adjacent to the first and second side baffles. The bass-reflex loudspeaker further includes a driver mounted to the front baffle, and a first port mounted to the loudspeaker cabinet, where the first port includes a first duct configured as a first integrated handle, and is further configured to accommodate the expansion and contraction of air resulting from the operation of the loudspeaker driver.

Other aspects, features, and techniques of the invention will be apparent to one skilled in the relevant art in view of the following detailed description of the invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF EXEMPLARY EMBODIMENTS

The present disclosure relates to a loudspeaker having a ported or bass-reflex design. One aspect of the disclosure related to incorporated one or more ports into the loudspeaker cabinet without requiring a corresponding increase in cabinet dimensions. In one embodiment, this may be accomplished by integrating the one or more ports into one or more corresponding side panels of the loudspeaker cabinet. In another embodiment, the port(s) may also (or instead) be incorporated into a rear panel of the subject loudspeaker.

Another aspect of the disclosure relates to configuring the aforementioned one or more ports to be integrated with and function as handles for gripping and/or transporting the subject loudspeaker.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment" or similar term means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner on one or more embodiments without limitation.

Figure 1:
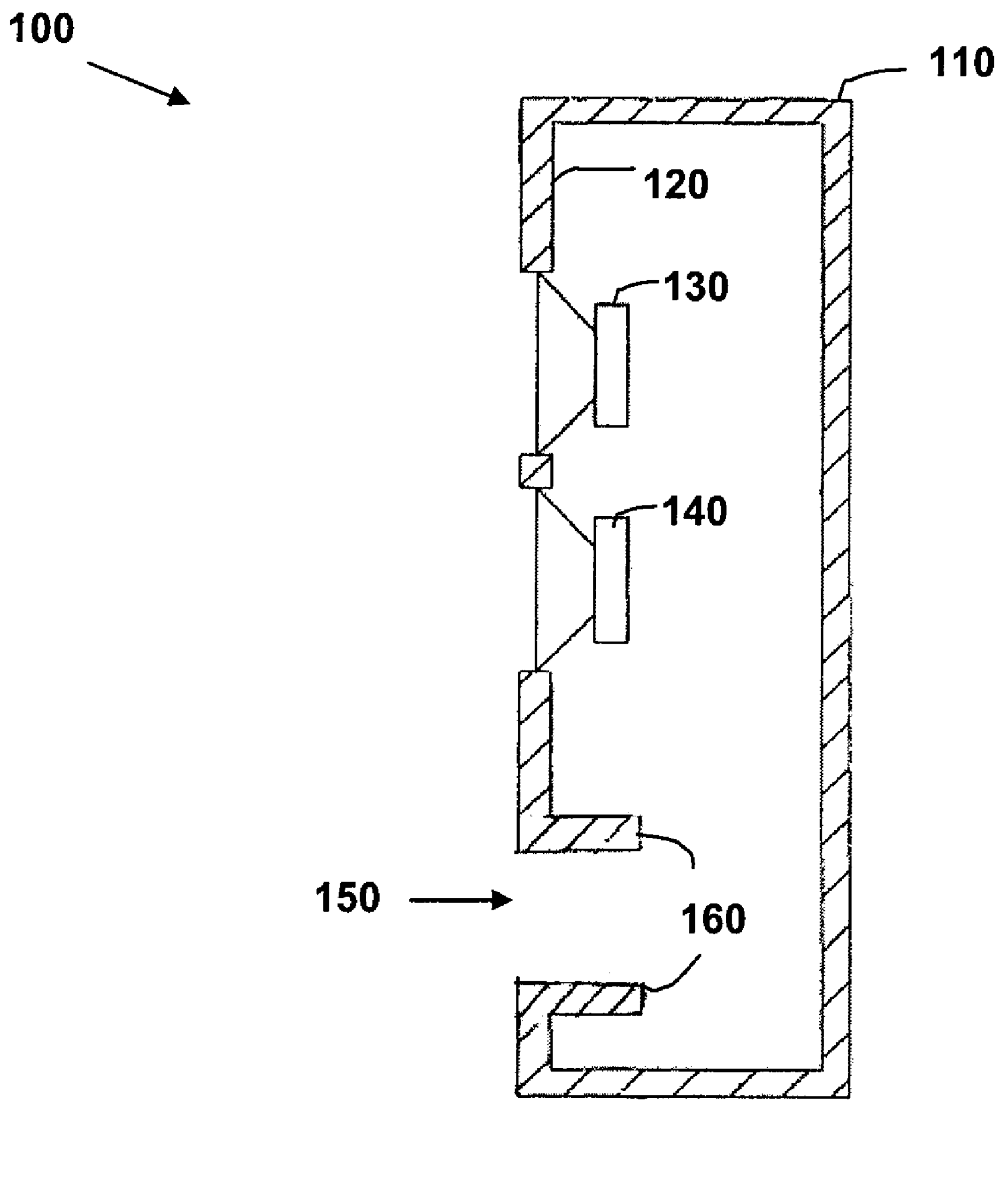
FIG. 1 illustrates a conventional ported loudspeaker of the prior art.
Figure 2A:
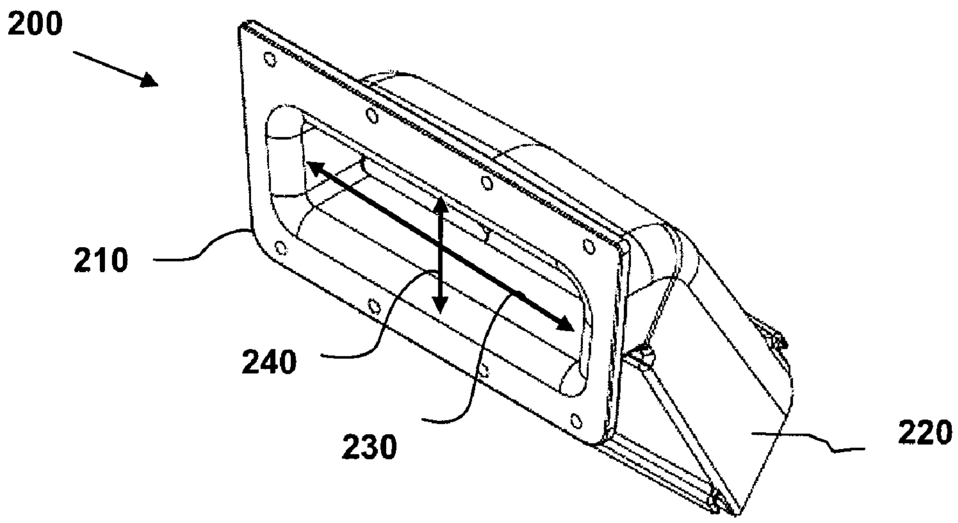
FIGS. 2A-2B depict a loudspeaker port configured in accordance with one embodiment of the invention.

Referring now to FIG. 2A, depicted is one embodiment of a loudspeaker port 200 in accordance with the principles of the invention. It should be appreciated that port 200 may be configured for installation into a bass-reflex loudspeaker housing/cabinet (not shown). While in one embodiment, the port 200 may be installed into a side baffle of the loudspeaker, in another embodiment it may be installed into a rear baffle of the cabinet.

Port 200 comprises a securing lip 210 for securing a duct 220 to the housing of a subject loudspeaker cabinet (e.g., side or rear baffle). The duct 220 is depicted as having a rectangular cross section, which may be defined by a width 230 and a height 240. In certain embodiments, the width 230 may range from 3.5 to 30 inches and the height 240 may range from 1 to 5 inches. However, it should be appreciated that particularly large or small loudspeakers may require different duct widths and/or heights. Moreover, while the port 200 has been depicted has having a generally rectangular cross section, it should be appreciated that numerous of configurations would be consistent with the principles of the invention (e.g., circular, oval, square, etc.). Such configuration may be influenced, for example, by the cabinet dimensions and/or the desire to use the port 200 as an integrated handle.

Figure 2B:
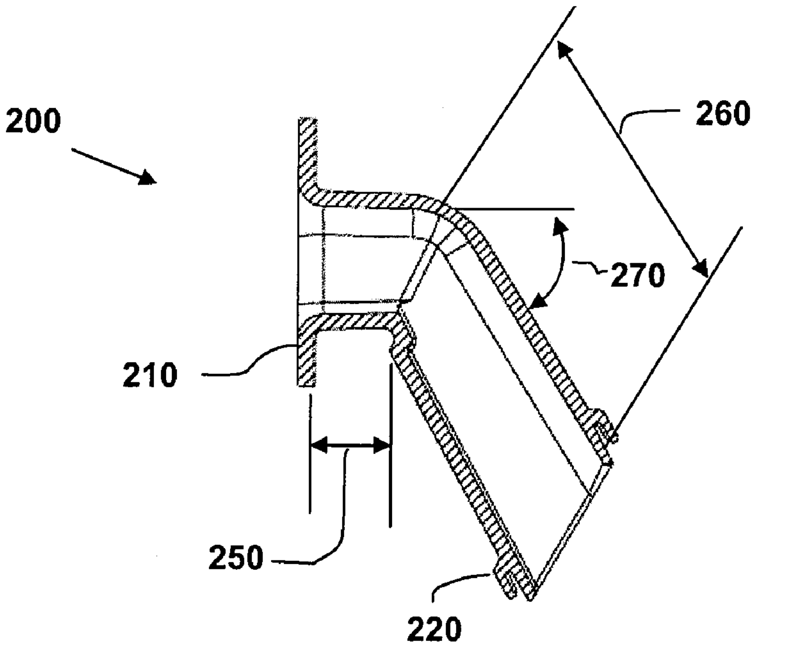

FIG. 2B depicts a cross-sectional view of port 200. As shown, the duct 220 may actually be represented by two segments—a first segment 250 and a second segment 260. In certain embodiments, the first segment 250 may range from 0.5 to 4 inches in length, while the second segment 260 may range from 1 to 30 inches in length. However, it should be appreciated that particularly large or small loudspeakers may require different segment lengths. Additionally, it should be noted that the first segment and second segment may be offset by some angle 270. To that end, angle 270 may range from 0 degrees to 90 degrees. Again, however, particularly large or small loudspeakers may require the angle 270 to be smaller or larger.

Figure 3:
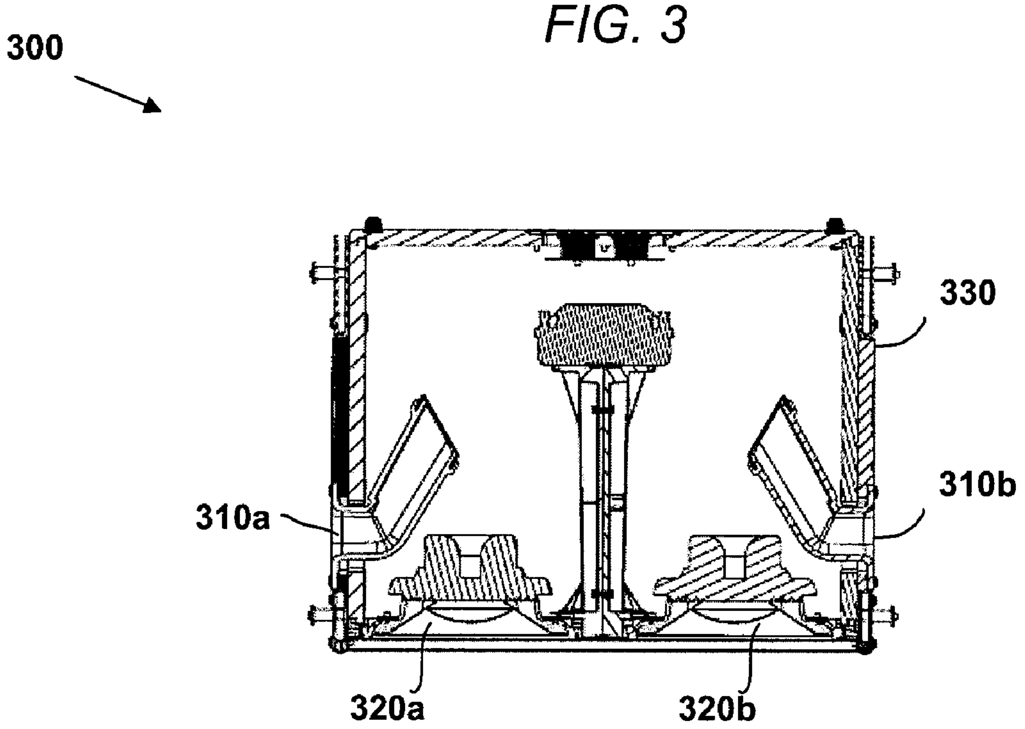
FIG. 3 is a top plan view of a loudspeaker configured in accordance with another embodiment of the invention.

Referring now to FIG. 3, depicted is a top plan view of one embodiment of a loudspeaker 300 in which two ports 310*a* and 310*b*, consistent with one embodiment of the invention, have been installed into the loudspeaker housing 330. As depicted, ports 310*a* and 310*b* are oriented and installed into the side baffles of the loudspeaker housing 330. Loudspeaker 300 further includes two drivers 320*a* and 320*b* attached to the front baffle of the loudspeaker housing 330. In one embodiment, this configuration enables the implementation of a ported loudspeaker without a corresponding increasing in the dimensions of the loudspeaker housing 330.

With specific reference to FIGS. 3A and 3B, the present invention has been found to be particularly useful in connection with cabinets having internal depth (d) dimensions with a range of about 6 to about 12 inches, corresponding to outer cabinet depth dimensions in the range of about 8 to about 14 inches. While the height and width dimensions of cabinet 102 are not particularly material in the context of the present invention, preferably cabinets having height dimensions in the range of about 12.5 to about 19 inches and width dimensions in the range of about 7.25 to about 9.5 inches are preferred.

While the principles of the invention are suitable for bass-reflex or ported loudspeakers having a variety of configurations and/or dimensions, in one embodiment the ports of the present invention (e.g., ports 310*a* and 310*b*) may be particularly useful loudspeaker cabinets having a depth greater than about 8 inches.

Loudspeakers, such as loudspeaker 100, are often times designed with handles given that the size and/or shape of their housings tend to make their transport difficult. To that end, in another embodiment the configuration of FIG. 3 further enables the ports 310*a* and 310*b* to be usable as handles for transporting or otherwise gripping the loudspeaker 300. In this fashion, additional labor and material expenses associated with equipping the loudspeaker 300 with handles may be minimized.

While not depicted, it should further be appreciated that the ports 310*a* and 310*b* may be covered by a screen or screen-like attachment so as to prevent foreign objects from entering the loudspeaker cabinet. This may be an issue when, for example, the subject loudspeaker is to be located outdoors for an extended period of time.

Figure 4:
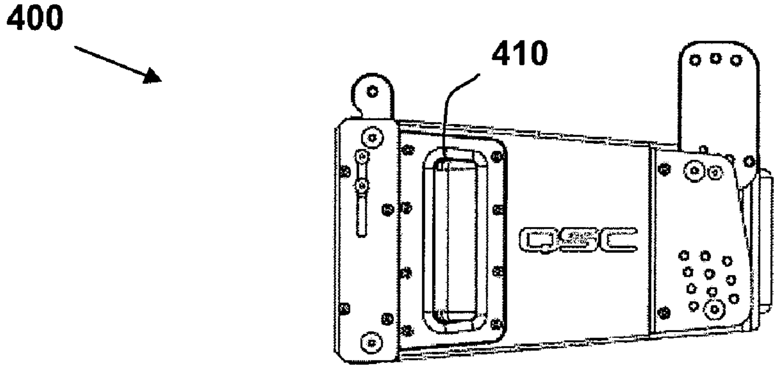
FIG. 4 is a side view of a loudspeaker configured in accordance with another embodiment of the invention.

FIG. 4 depicts a side view of another embodiment of a loudspeaker 400 into which a port 410, consistent with one embodiment of the invention, is shown has having been installed into a side baffle of the loudspeaker housing. In another embodiment, another port may similarly be installed on the opposite side of the loudspeaker 400 so as to provide a pair of "handles" for loudspeaker transport.

Figure 5:
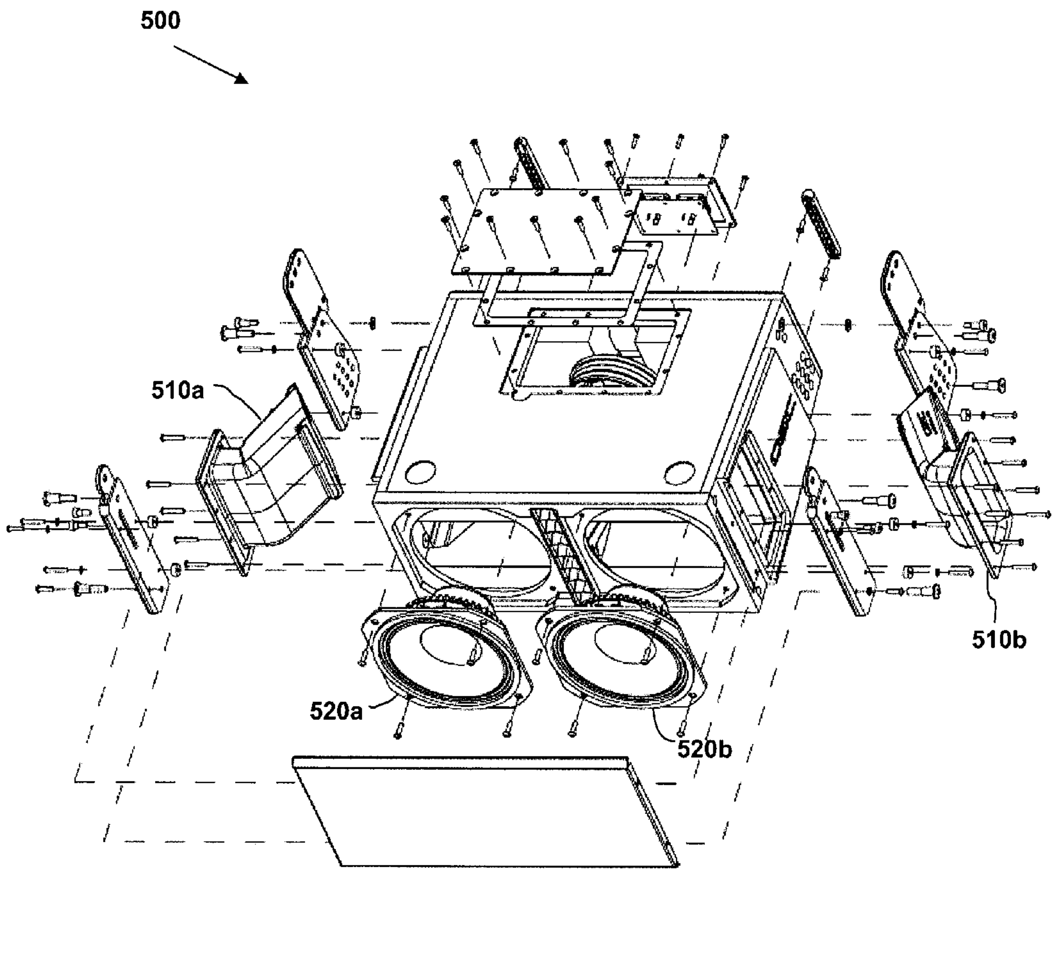
FIG. 5 is a detailed expanded view of a loudspeaker configured in accordance with still another embodiment of the invention.

FIG. 5 depicts a detailed expanded view of a loudspeaker 500 designed in accordance with one embodiment of the invention. Here again two ports 510*a* and 510*b* are installed into the respective side baffles of the subject loudspeaker. Two drivers 520*a* and 520*b* are correspondingly installed into the front baffle of the loudspeaker, thereby eliminating the need to increase the width and/or height of the loudspeaker.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A bass-reflex loudspeaker comprising:

a loudspeaker cabinet having a front baffle, a first side baffle adjacent to said front baffle, a second side baffle adjacent to said front baffle, and a rear baffle oriented opposite to said front baffle and adjacent to said first and second side baffles;

a driver mounted to the front baffle; and a first port mounted to the loudspeaker cabinet, wherein said first port comprises a first duct that is distinct and separate from the loudspeaker cabinet and which is configured as a first integrated handle, and further configured to accommodate the expansion and contraction of air resulting from the operation of said driver, wherein said first duct has a two-segment design, wherein the two-segment design comprises a first segment and a second segment, wherein said first segment is offset from said second segment by an offset angle.

2. The bass-reflex loudspeaker of claim 1, wherein said first duct is mounted to the first side baffle and extends from the first side baffle into said loudspeaker cabinet.

3. The bass-reflex loudspeaker of claim 1, wherein said first duct is configured as a first integrated handle for transporting or gripping the bass-reflex loudspeaker.

4. The bass-reflex loudspeaker of claim 1, wherein said first segment is oriented substantially parallel to the front baffle, and the second segment is offset from the first segment by the offset angle such that the second segment extends away from the front baffle and towards the rear baffle.

5. The bass-reflex loudspeaker of claim 1, wherein said first duct has a rectangular cross section.

6. The bass-reflex loudspeaker of claim 1, wherein the first port is mounted to the first side baffle, and wherein the bass-reflex loudspeaker further comprises a second port mounted to the second side baffle, wherein said second port comprises a second duct configured as a second integrated handle, and is further configured to accommodate the expansion and contraction of air resulting from the operation of said driver.

7. The bass-reflex loudspeaker of claim 6, wherein said second duct extends from said second side baffle into said loudspeaker cabinet.

8. The bass-reflex loudspeaker of claim 1, wherein the first port is mounted to the rear baffle of the loudspeaker cabinet.

9. The bass-reflex loudspeaker of claim 1, wherein said first duct is configured as a first integrated handle for transporting or gripping the bass-reflex loudspeaker.

10. The bass-reflex loudspeaker of claim 1, wherein said first segment is oriented substantially parallel to the front baffle, and the second segment is offset from the first segment by the offset angle such that the second segment extends away from the front baffle and towards the rear baffle.

11. A bass-reflex loudspeaker comprising:

a loudspeaker cabinet having a front baffle, a first side baffle adjacent to said front baffle, a second side baffle adjacent to said front baffle, and a rear baffle oriented opposite to said front baffle and adjacent to said first and second side baffles;

a driver mounted to the front baffle; and a first port mounted to the first side baffle loudspeaker cabinet, wherein said first port comprises a first duct that is distinct and separate from the loudspeaker cabinet and which is configured as a first integrated handle, and further configured to accommodate the expansion and contraction of air resulting from the operation of said driver; and a second port mounted to the second side baffle, wherein said second port comprises a second duct configured as a second integrated handle, and is further configured to accommodate the expansion and contraction of air resulting from the operation of said driver, wherein said each of the first and second ducts has a two-segment design, wherein the two-segment design comprises a first segment and a second segment, wherein each of said first segments is offset from said second segment by an offset angle.

12. The bass-reflex loudspeaker of claim 11, wherein said each of the first and second ducts is configured as an integrated handle for transporting or gripping the bass-reflex loudspeaker.

13. The bass-reflex loudspeaker of claim 11, wherein said first segment is oriented substantially parallel to the front baffle, and the second segment is offset from the first segment by the offset angle such that the second segment extends away from the front baffle and towards the rear baffle.

14. The bass-reflex loudspeaker of claim 11, wherein each of the first and second ducts has a rectangular cross section.

15. A loudspeaker port configured for use with a bass-reflex loudspeaker comprising:

a securing lip configured to be mounted to a first baffle of the bass-reflex loudspeaker;

a duct, extending from the securing lip into a cabinet of the bass-reflex loudspeaker, wherein the duct is distinct and separate form the loudspeaker cabinet and is configured as an integrated handle for the bass-reflex loudspeaker, and further configured to accommodate the expansion and contraction of air resulting from operation of a loudspeaker driver, wherein said duct has a two-segment design, wherein the two segment design comprises a first segment and a second segment, wherein said first segment is offset from said second segment by an offset angle.

16. The loudspeaker port of claim 15, wherein said duct is configured as a first integrated handle for transporting or gripping a bass-reflex loudspeaker.

17. The loudspeaker port of claim 15, wherein said first segment is oriented substantially perpendicular to the first baffle, and the second segment is offset from the first segment by the offset angle such that the second segment extends away from a front baffle of the bass-reflex loudspeaker.

18. The loudspeaker port of claim 15, wherein the first duct has a rectangular cross section.

19. A bass-reflex loudspeaker comprising:

a loudspeaker cabinet having a front baffle, a first side baffle adjacent to said front baffle, a second side baffle adjacent to said front baffle, and a rear baffle oriented opposite to said front baffle and adjacent to said first and second side baffles;

a driver mounted to the front baffle; and a handle mounted to the loudspeaker cabinet, wherein the handle comprises a port integrated with a duct that is distinct and separate from the loudspeaker cabinet and which extends into the loudspeaker cabinet to accommodate the expansion and contraction of air resulting from the operation of said driver, wherein said first duct has a two-segment design, wherein the two-segment design comprises a first segment and a second segment, wherein said first segment is offset from said second segment by an offset angle.

* * * * *